(12) United States Patent
Ju et al.

(10) Patent No.: US 12,471,479 B2
(45) Date of Patent: Nov. 11, 2025

(54) DISPLAY DEVICE COMPRISING TOUCH SENSOR

(71) Applicant: SAMSUNG DISPLAY CO., LTD., Yongin-si (KR)

(72) Inventors: Jin Ho Ju, Yongin-si (KR); Youn Joon Kim, Yongin-si (KR); Ki June Lee, Yongin-si (KR); Sung Eun Lee, Yongin-si (KR); Jong Hyun Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 37 days.

(21) Appl. No.: 18/454,440

(22) Filed: Aug. 23, 2023

(65) Prior Publication Data

US 2024/0292706 A1 Aug. 29, 2024

(30) Foreign Application Priority Data

Feb. 27, 2023 (KR) .................. 10-2023-0026301

(51) Int. Cl.
*G06F 3/044* (2006.01)
*H10K 59/40* (2023.01)
*H10K 59/50* (2023.01)
*H10K 59/80* (2023.01)

(52) U.S. Cl.
CPC ............ *H10K 59/40* (2023.02); *G06F 3/044* (2013.01); *H10K 59/873* (2023.02); *H10K 59/8792* (2023.02)

(58) Field of Classification Search
CPC ...... G06F 3/044; H10K 59/40; H10K 59/873; H10K 59/8792
See application file for complete search history.

(56) References Cited

U.S. PATENT DOCUMENTS

| 10,686,154 | B2 | 6/2020 | Kim et al. |
| 10,763,312 | B2 | 9/2020 | Jo et al. |
| 11,009,976 | B2 | 5/2021 | Yang et al. |
| 11,217,651 | B2 * | 1/2022 | Tada ............. H10K 59/131 |

(Continued)

FOREIGN PATENT DOCUMENTS

| CN | 110471569 A | * 11/2019 | ......... G02F 1/13338 |
| CN | 110957348 A | * 4/2020 | .......... H01L 27/322 |

(Continued)

OTHER PUBLICATIONS

Translation of CN-110471569-A (Year: 2019).*

(Continued)

*Primary Examiner* — Lixi C Simpson
(74) *Attorney, Agent, or Firm* — F. CHAU & ASSOCIATES, LLC

(57) ABSTRACT

A display device comprises a display part and a sensor part. The display part includes an emission layer emitting light, and the sensor part is disposed on the display part. The sensor part includes a first conductive pattern layer, a second conductive pattern layer, and a functional insulating layer disposed between the first conductive pattern layer and the second conductive pattern layer. The functional insulating layer absorbs light in a non-emission wavelength band different from a wavelength band of the light emitted from the emission layer.

24 Claims, 8 Drawing Sheets

(56) References Cited

U.S. PATENT DOCUMENTS

| | | | | |
|---|---|---|---|---|
| 2022/0293890 A1* | 9/2022 | Jeong | ................. | H10K 59/40 |
| 2023/0053037 A1* | 2/2023 | Choi | ................. | H01L 25/18 |
| 2023/0086323 A1* | 3/2023 | Kwon | ............. | H10K 59/8791 |
| | | | | 257/91 |
| 2023/0113862 A1* | 4/2023 | Kim | ................. | C07D 497/06 |
| | | | | 257/40 |
| 2023/0422585 A1* | 12/2023 | Jeong | ............. | H10K 59/8792 |

FOREIGN PATENT DOCUMENTS

| | | | | | |
|---|---|---|---|---|---|
| CN | 112420955 A | * | 2/2021 | ............ | H01L 27/322 |
| JP | 2012212076 A | * | 11/2012 | ............ | G06F 3/0412 |
| KR | 10-1750428 | | 6/2017 | | |
| KR | 10-2018-0074985 | | 7/2018 | | |
| KR | 10-2018-0089605 | | 8/2018 | | |
| KR | 10-2022-0129139 | | 9/2022 | | |

OTHER PUBLICATIONS

Translation of CN-112420955-A (Year: 2021).*
Translation of JP-2012212076-A (Year: 2012).*
Translation of CN-110957348-A (Year: 2020).*

* cited by examiner

DISPLAY DEVICE COMPRISING TOUCH SENSOR

This application claims priority to and benefit of Korean patent application No. 10-2023-0026301 under 35 U.S.C. § 119, filed on Feb. 27, 2023, in the Korean Intellectual Property Office, the entire contents of which are incorporated by reference herein.

BACKGROUND

1. Field

One or more embodiments described herein relate to a display device comprising a touch sensor.

2. Description of the Related Art

Many types of electronic devices include a display device to communicate information to users. The display device may comprise a display panel for displaying images and a sensing panel for sensing an object. The sensing panel may be used to determine the position of a touch input provided by a user.

The processes used to manufacture display devices comprise may operations. In order to reduce costs, it is desirable to reduce the number of operations used during manufacture.

SUMMARY

An object of the disclosure relates to a display device comprising a touch sensor, and a methods of manufacturing the display device using a simplified number of process operations in order to reduce costs.

Another object of the disclosure is to provide a touch senor on a display panel, where the touch sensor includes a functional layer which operates as a color filter or reflection control layer for the display panel, thereby alleviating the formation of such a color filter or reflection control layer during manufacture of the display panel.

Another object of the disclosure is to provide the functional layer to absorb light in a non-emission wavelength band different from the a wavelength band of light emitted from an emission layer of the display panel.

These and/or other benefits and features of the disclosed embodiments are discussed in detail below.

According to an embodiment of the disclosure, a display device may comprise a display part comprising an emission layer emitting light, and a sensor part disposed on the display part and comprising a first conductive pattern layer, a second conductive pattern layer, and a functional insulating layer disposed between the first conductive pattern layer and the second conductive pattern layer. The functional insulating layer may absorb light in a non-emission wavelength band different from a wavelength band of the light emitted from the emission layer.

According to an embodiment, the non-emission wavelength band may comprise a first non-emission wavelength band and a second non-emission wavelength band. The wavelength band of the light emitted from the emission layer may comprise a first wavelength band, a second wavelength band, and a third wavelength band. The first non-emission wavelength band may comprise a wavelength band between the third wavelength band and the second wavelength band. The second non-emission wavelength band may comprise a wavelength band between the second wavelength band and the first wavelength band.

According to an embodiment, the first non-emission wavelength band may comprise at least partial band of 460 nm to 520 nm. The second non-emission wavelength band may comprise at least partial band of 560 nm to 620 nm.

According to an embodiment, the first wavelength band may be a red wavelength band. The second wavelength band may be a green wavelength band. The third wavelength band may be a blue wavelength band.

According to an embodiment, the first wavelength band may be a wavelength band of 600 nm to 750 nm. The second wavelength band may be a wavelength band of 480 nm to 560 nm. The third wavelength band may be a wavelength band of 370 nm to 460 nm.

The functional insulating layer may comprise a dye, a pigment, or a combination thereof.

According to an embodiment, one surface of the functional insulating layer may contact the first conductive pattern layer. Another surface of the functional insulating layer may contact the second conductive pattern layer.

According to an embodiment, the sensor part may comprise a protective layer disposed on the second conductive pattern layer. The light emitted from the emission layer may be emitted by sequentially passing through the functional insulating layer and the protective layer.

According to an embodiment, the display device may further comprise a light blocking layer disposed on the sensor part. The light blocking layer may overlap the first conductive pattern layer and the second conductive pattern layer when viewed from plan view. The light blocking layer and the functional insulating layer may be physically separated from each other.

According to an embodiment, the first conductive pattern layer and the second conductive pattern layer may be electrically connected to each other through a contact portion passing through the functional insulating layer.

According to an embodiment, the display part may comprise a light emitting element comprising a first electrode, a second electrode, and the emission layer electrically connected between the first electrode and the second electrode, a low-reflection inorganic layer disposed on the light emitting element, and an encapsulation layer disposed on the low-reflection inorganic layer.

According to an embodiment, the second electrode may be disposed on the emission layer. Light reflected by the low-reflection inorganic layer and light reflected by the second electrode may interfere destructively with each other.

According to an embodiment, the sensor part may be directly disposed on the encapsulation layer.

According to an embodiment of the disclosure, a display device may comprise a display part comprising an emission layer emitting light, and a sensor part disposed on the display part, and comprising a first conductive pattern layer, a second conductive pattern layer, an interlayer insulating layer disposed between the first conductive pattern layer and the second conductive pattern layer, and a functional insulating layer disposed on the second conductive pattern layer. The functional insulating layer may absorb light of a non-emission wavelength band different from a wavelength band of the light emitted from the emission layer.

According to an embodiment, the non-emission wavelength band may comprise a first non-emission wavelength band and a second non-emission wavelength band. The wavelength band of the light emitted from the emission layer may comprise a first wavelength band, a second wavelength band, and a third wavelength band. The first non-emission wavelength band may comprise a wavelength band between the third wavelength band and the second wavelength band. The second non-emission wavelength band may comprise a wavelength band between the second wavelength band and the first wavelength band.

According to an embodiment, the first non-emission wavelength band may comprise at least partial band of 460 nm to 520 nm. The second non-emission wavelength band may comprise at least partial band of 560 nm to 620 nm. The first wavelength band may be a red wavelength band. The second wavelength band may be a green wavelength band. The third wavelength band may be a blue wavelength band.

According to an embodiment, the display part may comprise a light emitting element comprising a first electrode, a second electrode, and the emission layer electrically connected between the first electrode and the second electrode, a low-reflection inorganic layer disposed on the light emitting element, and an encapsulation layer disposed on the low-reflection inorganic layer.

According to an embodiment, the second electrode may be disposed on the emission layer. Light reflected by the low-reflection inorganic layer and light reflected by the second electrode may interfere destructively with each other.

According to an embodiment, the functional insulating layer may contact the second conductive pattern layer and may not contact the first conductive pattern layer.

The functional insulating layer may comprise a dye, a pigment, or a combination thereof.

According to an embodiment of the disclosure, a display device comprising a touch sensor, in which a manufacturing process step may be simplified and a process cost may be reduced may be provided.

According to one or more additional embodiments, a display device includes a display panel comprising an emission layer and a touch sensor disposed on the display panel and including a functional insulating layer, wherein: the emission layer is configured to emit light in a first wavelength band, the functional insulating layer is configured to absorb light in a non-emission wavelength band different from the first wavelength band, and the emission layer is to emit light in the first wavelength band through the functional insulating layer of the touch sensor.

The touch sensor may include a first conductive pattern layer and a second conductive pattern layer which overlap a pixel defining layer of the display panel, and the functional insulating layer may be between the first conductive pattern layer and the second conductive pattern layer. The non-emission wavelength band may be adjacent to the first wavelength band. The second conductive pattern layer may be disposed over the first conductive pattern layer, and the functional insulating layer may be on an upper surface of the second conductive pattern layer. The functional insulating layer may be or operate as a reflection control layer.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENT

Figure 1:
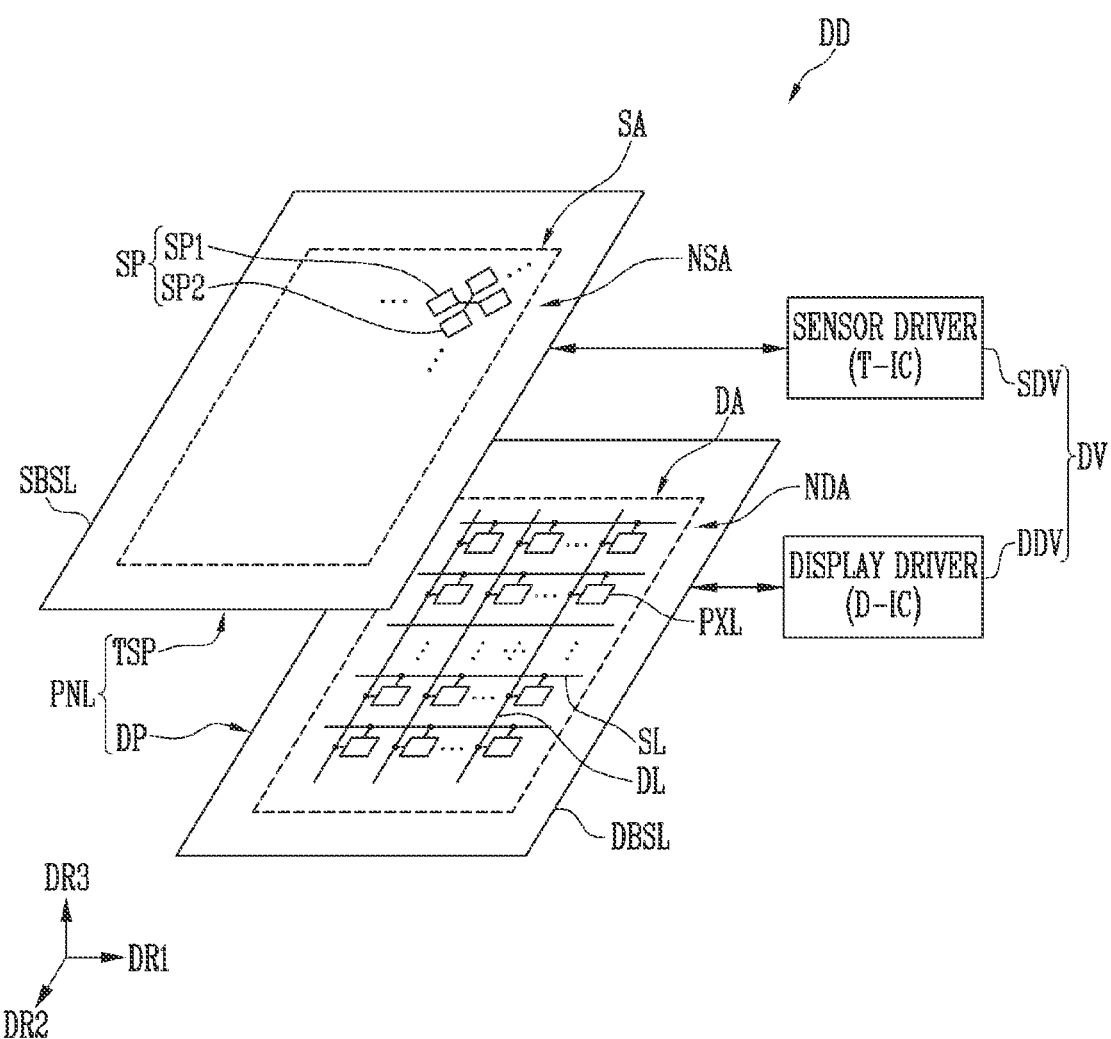
FIG. 1 is a diagram illustrating a display device according to an embodiment.

The disclosure may be modified in various manners and have various forms. Therefore, specific embodiments will be illustrated in the drawings and will be described in detail in the specification. However, it should be understood that the disclosure is not intended to be limited to the disclosed specific forms, and the disclosure comprises all modifications, equivalents, and substitutions within the spirit and technical scope of the disclosure.

Terms of "first", "second", and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component. In the following description, the singular expressions comprise plural expressions unless the context clearly dictates otherwise.

It should be understood that in the present application, a term of "comprise", "have", or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance. In addition, a case where a portion of a layer, a layer, an area, a plate, or the like is referred to as being "on" another portion, it comprises not only a case where the portion is "directly on" another portion, but also a case where there is further another portion between the portion and another portion. In addition, in the present specification, when a portion of a layer, a layer, an area, a plate, or the like is formed on another portion, a forming direction is not limited to an upper direction but comprises forming the portion on a side surface or in a lower direction. On the contrary, when a portion of a layer, a layer, an area, a plate, or the like is formed "under" another portion, this comprises not only a case where the portion is "directly beneath" another portion but also a case where there is further another portion between the portion and another portion.

The disclosure relates to a display device comprising a touch sensor. Hereinafter, a display device comprising a touch sensor according to an embodiment is described with reference to the accompanying drawings.

Figure 2:
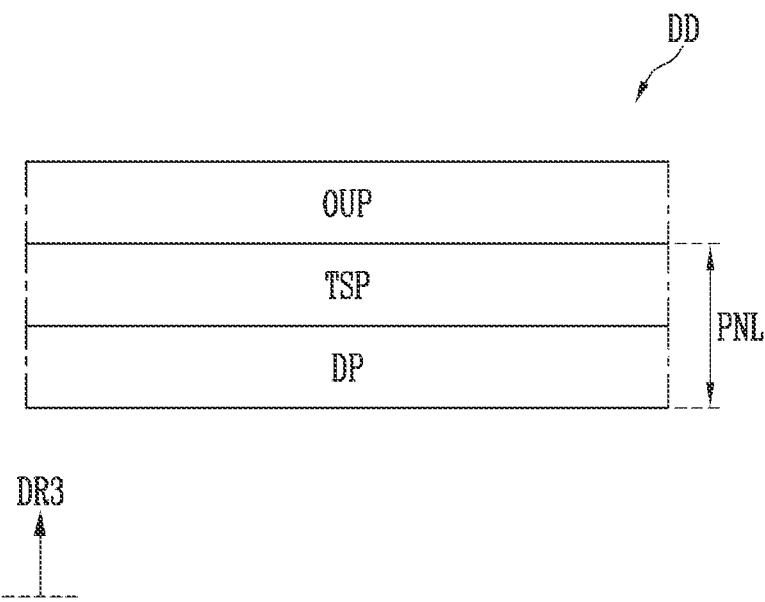
FIG. 2 is a schematic cross-sectional view illustrating a stack structure of a display device according to an embodiment.

FIG. 1 is a diagram illustrating a display device DD according to an embodiment. FIG. 2 is a schematic cross-sectional view illustrating a stack structure of a display device DD according to an embodiment.

Referring to FIGS. 1 and 2, the display device DD is configured to provide (or emit) light. The display device DD may comprise a panel PNL and a driving circuit unit DV for driving the panel PNL. The display device DD may further comprise an outer part OUP.

The panel PNL may comprise a display part DP for displaying an image and a sensor part TSP configured to sense a user input (for example, a touch input). The display part DP may be referred to as a display panel. The sensor part TSP may be referred to as a sensing panel or a touch sensor.

The panel PNL may comprise pixels PXL and sensing electrodes SP. According to an embodiment, the pixels PXL may emit light to display an image in a display frame period unit. The sensing electrodes SP may sense an input (for example, a touch input) of a user in a sensing frame period unit. A sensing frame period and a display frame period may be independent of each other and/or may be different from each other. The sensing frame period and the display frame period may be synchronized with each other or the display panel DP and the sensor part may be driven asynchronously.

The sensor part TSP comprising the sensing electrodes SP may obtain information on the touch input of the user. According to an embodiment, the sensing electrodes SP may be driven by a mutual capacitance method. For example, the sensing electrodes SP may comprise a first sensing electrode SP1 providing a first sensing signal and a second sensing electrode SP2 providing a second sensing signal. According to an embodiment, the first sensing electrode SP1 may be a Tx (transmitter) pattern electrode, and the second sensing electrode SP2 may be an Rx (receiver) pattern electrode. According to an embodiment, the information on the touch input (or a touch event) may include information indicative of a position of a touch provided by the user.

However, the disclosure is not limited thereto. For example, the sensing electrodes SP may be driven by a self-capacitance method according to an embodiment. In one embodiment, the sensing electrodes SP may be configured of one type of sensing electrodes without distinction between the first sensing electrode SP1 and the second sensing electrode SP2.

The driving circuit unit (or driving circuit) DV may comprise a display driver DDV for driving the display part DP and a sensor driver SDV for driving the sensor part TSP.

The display part DP may comprise a display base layer DBSL and the pixels PXL provided on the display base layer DBSL. The pixels PXL may be disposed in a display area DA.

The display base layer DBSL (or the display device DD) may comprise the display area DA in which an image is displayed and a non-display area NDA outside the display area DA. According to an embodiment, the display area DA may be disposed in a central area of the display part DP, and the non-display area NDA may be disposed adjacent to a periphery of the display area DA.

The display base layer DBSL may be a base substrate or a base member for supporting the display device DD. The base layer may be a rigid substrate of a glass material. In one embodiment, the base layer may be a flexible substrate of which bending, folding, rolling, or the like is possible. In this case, the base layer may comprise an insulating material such as a polymer resin, one example of which is polyimide. However, the disclosure is not particularly limited thereto.

Scan lines SL and data lines DL, and the pixels PXL connected to the scan lines SL and the data lines DL, are disposed in the display area DA. The pixels PXL may be configured to be selected by a scan signal having a turn-on level supplied from the scan lines SL. The pixels PXL may receive a data signal from the data lines DL and emit light of a luminance corresponding to the data signal. Accordingly, an image corresponding to the data signal is displayed in the display area DA. However, the structure, driving method, and the like of the pixels PXL may vary among embodiments.

Various lines and/or built-in circuit units connected to the pixels PXL of the display area NDA may be disposed in the non-display area NDA. For example, a plurality of lines for supplying various power and control signals to the display area DA may be disposed in the non-display area NDA.

The display part DP may output visual information (for example, an image). According to an embodiment, the type/kind of the display part DP is not particularly limited. For example, the display part DP may be implemented as a self-emission type display panel such as an organic light emitting display panel. However, when the display part DP is implemented as a self-emission type, each pixel is not limited to a case in which only an organic light emitting element is comprised. For example, a light emitting element of each pixel may be formed of an organic light emitting diode, an inorganic light emitting diode, a quantum dot/well light emitting diode, or the like. Hereinafter, for convenience of description, the disclosure is described based on an embodiment in which the display part DP is implemented as an organic light emitting display panel.

The sensor part TSP comprises a sensor base layer SBSL and a plurality of sensing electrodes SP formed on the sensor base layer SBSL. The sensing electrodes SP may be disposed in a sensing area SA on the sensor base layer SBSL.

The sensor base layer SBSL (or the display device DD) may comprise a sensing area SA where a touch input or the like may be sensed, and a non-sensing area NSA around the sensing area SA. According to an embodiment, the sensing area SA may be disposed to overlap at least one area of the display area DA. For example, the sensing area SA may be an area corresponding to the display area DA (for example, an area overlapping the display area DA). The non-sensing area NSA may be an area corresponding to the non-display area NDA (for example, an area overlapping the non-display area NDA). In this case, when the touch input or the like is provided on the display area DA, the touch input may be detected through the sensor part TSP.

The sensor base layer SBSL may comprise one or more insulating layers (for example, an insulating layer INS (refer to FIG. 4)). For example, the insulating layer INS for forming the sensor base layer SBSL may be disposed on the display part DP to form a base for forming the sensing electrodes SP. However, an example for forming the sensor base layer SBSL is not particularly limited.

The sensing area SA is an area configured to respond to the touch input (that is, an active area of a sensor). To this end, the sensing electrodes SP for sensing the touch input or the like may be disposed in the sensing area SA.

The sensor part TSP may obtain information on an input provided from the user. The sensor part TSP may recognize the touch input. In one embodiment, the sensor part TSP may recognize the touch input using a capacitive sensing method. For example, the sensor part TSP may sense the touch input using a mutual capacitance method or may sense the touch input using a self-capacitance method.

According to an embodiment, each of the first sensing electrodes SP1 may extend in a first direction DR1. The first sensing electrodes SP1 may be arranged in a second direction DR2. The second direction DR2 may be different from the first direction DR1. For example, the second direction DR2 may be a direction perpendicular to the first direction DR1. Each of the first sensing electrodes SP1 may have a form in which first cells of a relatively large area and first bridge electrodes of a relatively small area are connected to each other. The first sensing electrodes SP1 may generally have a predetermined shape, e.g., a diamond shape. However, the shape of the first sensing electrodes SP1 may be different from a diamond shape in another embodiment.

According to an embodiment, each of the second sensing electrodes SP2 may extend in the second direction DR2. The second sensing electrodes SP2 may be arranged in the first direction DR1. Each of the second sensing electrodes SP2 may have a form in which second cells of a relatively large area and second bridge electrodes of a relatively small area are connected to each other. The second sensing electrodes SP2 may generally have a diamond shape. However, the shape of the second sensing electrodes SP2 may be different from a diamond shape in another embodiment.

According to an embodiment, the first sensing electrodes SP1 and the second sensing electrodes SP2 may have the same (for example, substantially the same) shape. For example, the first sensing electrodes SP1 which are Tx patterns and the second sensing electrodes SP2 which are Rx patterns may have substantially the same shape. Thus, sensing performance of a touch event may be uniformly set within the sensing area SA. In other embodiments, the first sensing electrodes SP1 and the second sensing electrodes SP2 may have different shapes.

Meanwhile, sensing lines for electrically connecting the sensing electrodes SP to the sensor driver SDV and the like may be disposed in the non-sensing area NSA of the sensor part TSP.

The driving circuit unit DV may comprise a display driver DDV for driving the display part DP and a sensor driver SDV for driving the sensor part TSP. The display driver DDV is configured to be electrically connected to the display part DP to drive the pixels PXL. The sensor driver SDV is configured to be electrically connected to the sensor part TSP to drive the sensor part TSP.

The outer part OUP may be disposed substantially above the display device DD in a thickness direction (for example, a third direction DR3) of the display base layer DBSL. The outer part OUP may be disposed on the sensor part TSP. Light provided from the display part DP may pass through sensor part TSP and the outer part OUP for output to a user corresponding to an image.

The outer part OUP may comprise a light blocking layer BM to improve visibility of the display device DD. For example, the light blocking layer BM may be disposed to overlap the first sensing electrodes SP1 and the second sensing electrodes SP2 forming the sensor part TSP, to prevent a reduction in visibility by the first sensing electrodes SP1 and the second sensing electrodes SP2.

According to an embodiment, the outer part OUP may protect internal configurations of the display device DD from an external influence. For example, the outer part OUP may further comprise a window configured to transmit light.

Figure 3:
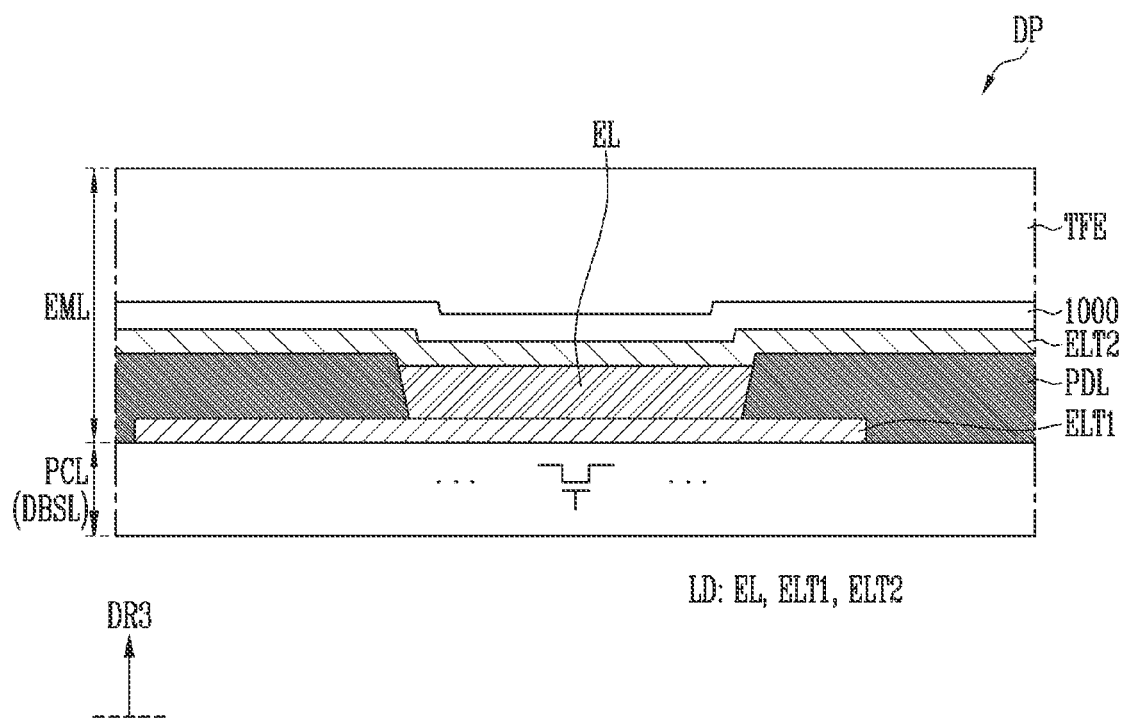
FIG. 3 is a schematic cross-sectional view illustrating a display part according to an embodiment.

FIG. 3 illustrates an embodiment of the display part DP, e.g., FIG. 3 provides a schematic cross-sectional view illustrating the display part according to an embodiment.

Referring to FIG. 3, the display part DP may comprise a pixel circuit layer PCL and a light-emitting-element layer EML. The pixel circuit layer PCL may comprise a pixel circuit for driving light emitting elements LD. The pixel circuit layer PCL may comprise the display base layer DBSL, conductive layers for forming pixel circuits, and insulating layers disposed between the conductive layers.

The pixel circuit may comprise a driving transistor. The pixel circuit may comprise a thin film transistor. The pixel circuit may be electrically connected to the light emitting elements LD to provide an electrical signal for the light emitting elements LD to emit light.

The light-emitting-element layer EML may be disposed on the pixel circuit layer PCL. According to an embodiment, the light-emitting-element layer EML may comprise the light emitting element LD, a pixel defining layer PDL, a low-reflection inorganic layer 1000, and an encapsulation layer TFE.

The light emitting element LD may be disposed on the pixel circuit layer PCL. According to an embodiment, the light emitting element LD may comprise a first electrode ELT1, an emission layer EL, and a second electrode ELT2. According to an embodiment, the emission layer EL may be disposed in an area defined by the pixel defining layer PDL. The pixel defining layer PDL may be adjacent to a periphery of the emission layer EL. One surface of the emission layer EL may be electrically connected to the first electrode ELT1, and another surface of the emission layer EL may be electrically connected to the second electrode ELT2.

The first electrode ELT1 may be an anode electrode for the emission layer EL, and the second electrode ELT2 may be a common electrode (or a cathode electrode) for the emission layer EL. According to an embodiment, the first electrode ELT1 and the second electrode ELT2 may comprise a conductive material. For example, the first electrode ELT1 may comprise a conductive material having a reflective property, and the second electrode ELT2 may comprise a transparent conductive material. However, the disclosure is not limited thereto.

The emission layer EL may have a multilayer thin film structure comprising a light generation layer. The emission layer EL may comprise a hole injection layer, a light generation layer, a hole blocking layer, an electron transport layer, and an electron injection layer. The hole injection layer may inject holes. The hole transport layer may have an excellent hole transport property and may suppress the movement of electrons that fail to combine with holes in the light generation layer, thereby increasing the chance of recombination of holes and electrons in the light generation layer. The light generation layer may emit light based on the recombination of injected electrons and holes. The hole blocking layer may suppress movement of holes that are not combined in the light generation layer. The electron transport layer may smoothly transport electrons to the light generation layer. The electron injection layer may inject electrons. The emission layer EL may emit light based on an electrical signal provided from the first electrode ELT1 and the second electrode ELT2.

According to an embodiment, the emission layer EL may emit light of one wavelength band. For example, the emission layer EL may comprise a first emission layer EL1 (e.g., refer to FIG. 5) configured to emit light of a first color of a first wavelength band, a second emission layer EL1 (e.g., refer to FIG. 5) configured to emit light of a second color of a second wavelength band, and a third emission layer EL3 (e.g., refer to FIG. 5) configured to emit light of a third color of a third wavelength band.

The first emission layer EL1 may form a first light emitting element emitting light of the first color. The second emission layer EL2 may form a second light emitting element emitting light of the second color. The third emission layer EL3 may form a third light emitting element emitting the light of the third color. The first color may be red. For example, the first wavelength band may be a wavelength band of about 600 nm to 750 nm. The second color may be green. For example, the second wavelength band may be about 480 nm to 560 nm. The third color may be blue. For example, the third wavelength band may be a wavelength band of about 370 nm to 460 nm. The first through third colors may be a different combination of colors in another embodiment.

According to an embodiment, the emission layer EL may not substantially emit light of a non-emission wavelength band. The non-emission wavelength band may, for example, be a wavelength band comprising a wavelength that does not partially overlap a wavelength band of light emitted from the emission layer EL.

According to an embodiment, the non-emission wavelength band may not overlap the wavelength band of the light emitted from the emission layer EL. For example, the non-emission wavelength band may not overlap the first wavelength band. The non-emission wavelength band may not overlap the second wavelength band. The non-emission wavelength band may not overlap the third wavelength band.

According to an embodiment, the non-emission wavelength band may comprise a first non-emission wavelength band and a second non-emission wavelength band. The second non-emission wavelength band may be a wavelength band greater than the first non-emission wavelength band. For example, the first non-emission wavelength band may comprise a wavelength band between the third wavelength band and the second wavelength band. The first non-emission wavelength band may comprise a wavelength band between a peak wavelength of the third wavelength band and a peak wavelength of the second peak wavelength band. The second non-emission wavelength band may comprise a wavelength band between the second wavelength band and the first wavelength band. The first non-emission wavelength band may comprise a wavelength band between a peak wavelength of the second wavelength band and a peak wavelength of the first peak wavelength band.

According to an embodiment, the first non-emission wavelength band may be about 460 nm to about 520 nm, or in one case about 490 nm to about 505 nm. According to an embodiment, the second non-emission wavelength band may be about 560 nm to about 620 nm, or in one case about 585 nm to about 600 nm. However, the disclosure is not necessarily limited thereto.

According to an embodiment, a reflection control layer RCL may be disposed and configured to selectively absorb light of at least one non-emission wavelength band of the emission layer EL. Thus, reflectance and color sense of the display device DD may be improved. Examples of these features are described in greater detail below.

For example, in accordance with one embodiment, the non-emission wavelength band may include a first non-emission wavelength band and a second non-emission wavelength band. The wavelength band of the light emitted from the emission layer may include a first wavelength band, a second wavelength band, and a third wavelength band. The first non-emission wavelength band may include a wavelength band between the third wavelength band and the second wavelength band, and the second non-emission wavelength band may include a wavelength band between the second wavelength band and the first wavelength band. In one embodiment, the first non-emission wavelength band may be in a wavelength band that is not between the second and third wavelength bands, e.g., may be included in another band different from wavelengths between the second and third wavelength bands. Additionally, or alternatively, the second non-emission wavelength band may not be between the first and second wavelength bands, e.g., may be included in another band different from wavelengths between the first and second wavelength bands.

The pixel defining layer PDL may be disposed on the pixel circuit layer PCL to define a position where the emission layer EL is disposed. The pixel defining layer PDL may comprise an organic material. According to an embodiment, the pixel defining layer PDL may comprise one or more of a group of acrylic resin, epoxy resin, phenol resin, polyamide resin, or polyimide resin. However, the disclosure is not limited thereto.

The low-reflection inorganic layer 1000 may be disposed on the light emitting element LD (for example, the second electrode ELT2). The low-reflection inorganic layer 1000 may be disposed between the encapsulation layer TFE and the light emitting element LD.

The low-reflection inorganic layer 1000 may comprise an inorganic material. For example, the low-reflection inorganic layer 1000 may comprise one or more of a metal or a metal compound. For example, the metal may comprise one or more of aluminum (Al), silver (Ag), magnesium (Mg), chromium (Cr), titanium (Ti), nickel (Ni), gold (Au), tantalum (Ta), copper (Cu), calcium (Ca), cobalt (Co), iron (Fe), molybdenum (Mo), tungsten (W), platinum (Pt), bismuth (Bi), or ytterbium (Yb). The metal compound may comprise one or more of a group silicon oxide ($SiO_x$), titanium oxide ($TiO_x$), zirconium oxide ($ZrO_x$), tantalum oxide ($Ta_xO_y$), hafnium oxide ($HfO_x$), aluminum oxide ($Al_xO_y$) zinc oxide ($ZnO_x$), yttrium oxide ($Y_xO_y$), beryllium oxide ($BeO_x$), magnesium oxide ($MgO_x$), lead oxide ($PbO_x$), tungsten oxide ($WO_x$), bismuth oxide ($BiO_x$), silicon nitride ($SiN_x$), lithium fluoride ($LiF_x$), calcium fluoride ($CaF_x$), magnesium fluoride ($MgF_x$), and cadmium sulfide ($CdS_x$). One or more of the above-described materials may be selected as the low-reflection inorganic layer 1000 in consideration of a refractive index and an absorption coefficient.

The low-reflection inorganic layer 1000 may reflect applied light. At this time, light reflected by the low-reflection inorganic layer 1000 and light reflected by some of the light emitting elements LD (for example, the second electrode ELT2) may interfere destructively with each other. Accordingly, external light reflectance of the display device DD may be reduced, and display quality and visibility of the display device DD may be improved.

The encapsulation layer TFE may be disposed on the low-reflection inorganic layer 1000. The encapsulation layer TFE may offset a step difference generated by the light emitting element LD, the low-reflection inorganic layer 1000, and the pixel defining layer PDL. The encapsulation layer TFE may comprise a plurality of insulating layers covering the light emitting element LD. According to an embodiment, the encapsulation layer TFE may have a structure in which an inorganic layer and an organic layer are alternately stacked. According to an embodiment, the encapsulation layer TFE may have a structure in which a first inorganic layer, an organic layer, and a second inorganic layer are sequentially stacked. According to an embodiment, the encapsulation layer TFE may be a thin film encapsulation layer.

Figure 5:
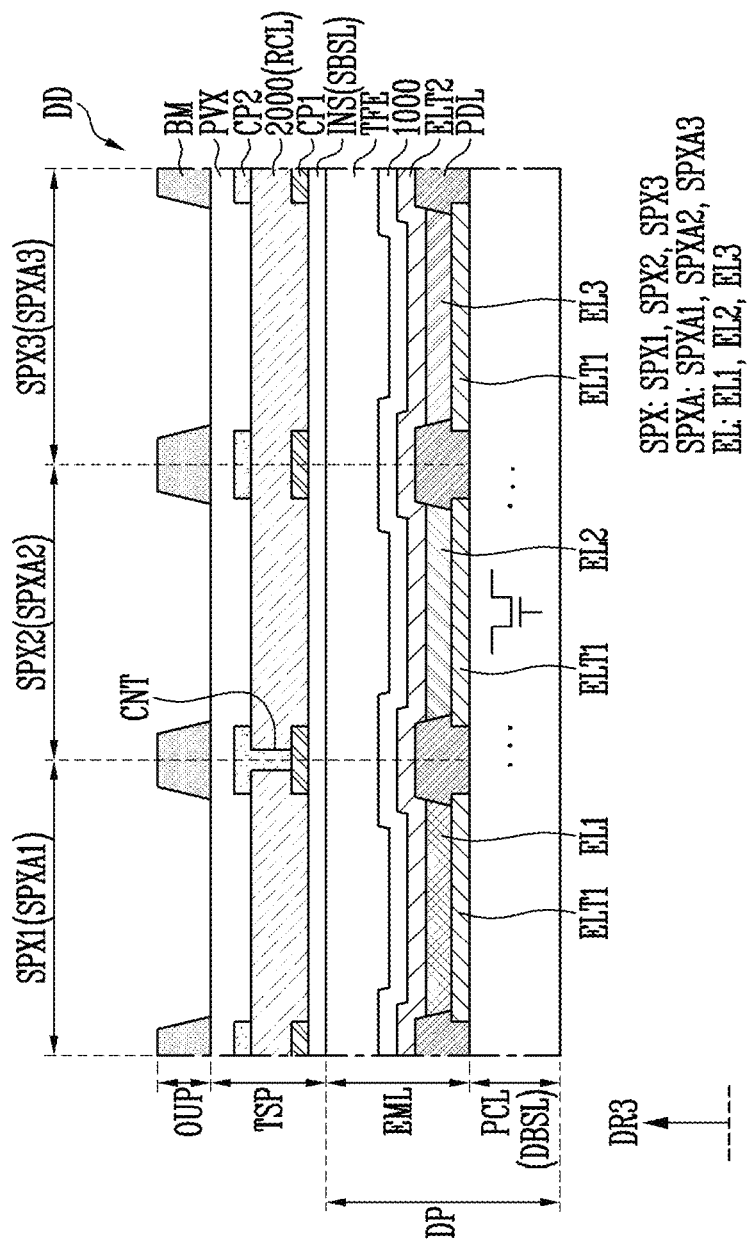
FIGS. 5 and 6 are schematic cross-sectional views illustrating a display device according to an embodiment.
Figure 6:
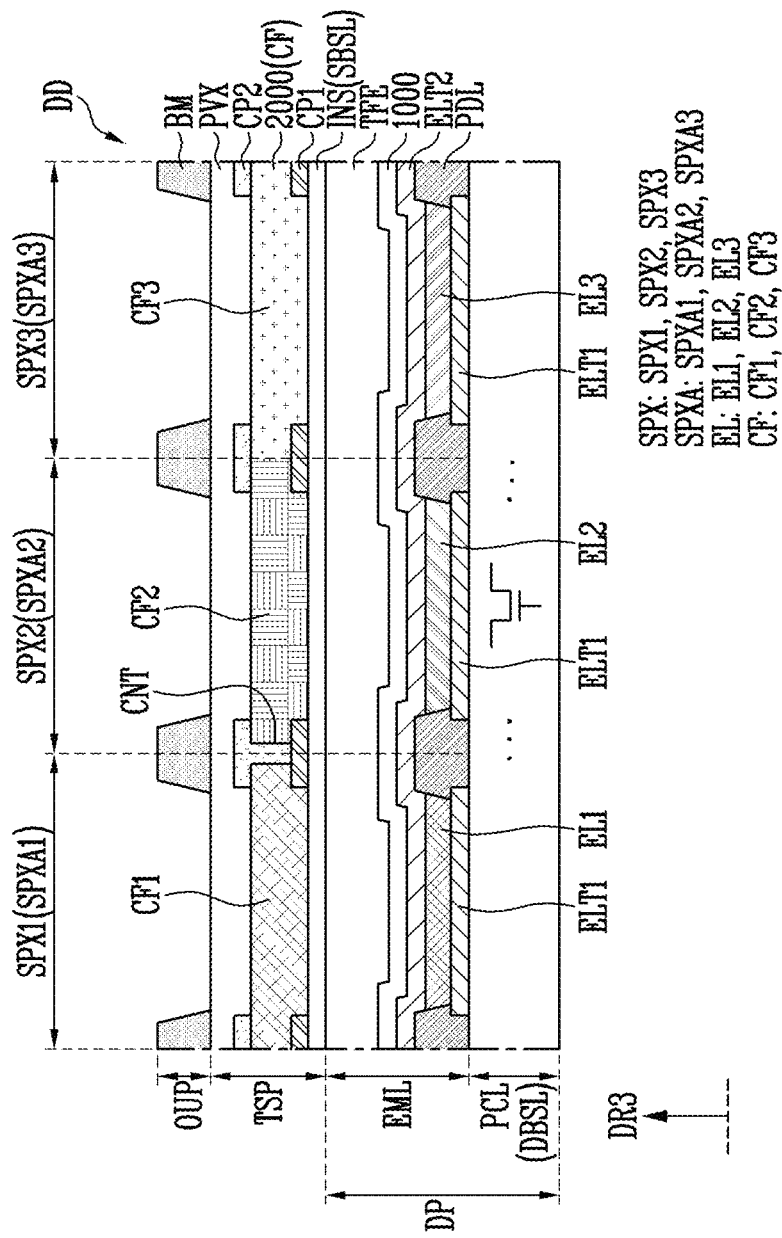

Next, a display device DD comprising a functional insulating layer 2000 according to an embodiment is described with reference to FIGS. 4 to 6.

Figure 4:
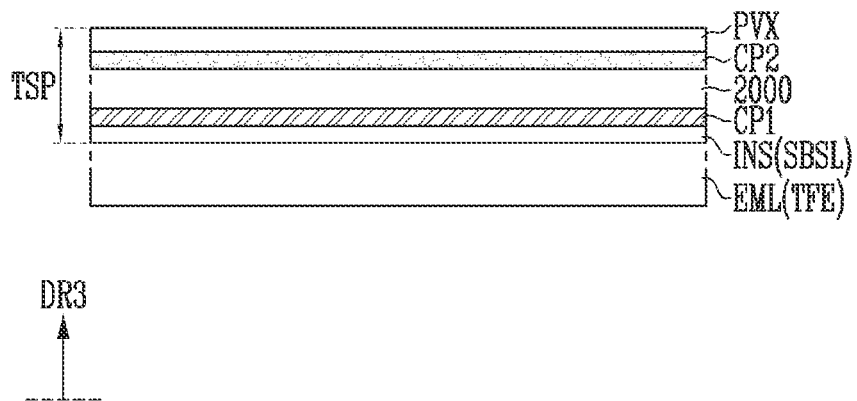
FIG. 4 is a schematic cross-sectional view illustrating a sensor part according to an embodiment.

FIG. 4 is a schematic cross-sectional view illustrating a sensor part according to an embodiment. FIGS. 5 and 6 are schematic cross-sectional views illustrating a display device according to an embodiment. In particular, FIG. 5 shows an embodiment in which the functional insulating layer 2000 is the reflection control layer RCL. FIG. 6 shows an embodiment in which the functional insulating layer 2000 is a color filter layer CF. Because the reflection control layer RCL and the color filter layer CF are included in the sensor part TSP, and not in the display part DP, the number of process operations to form the display part DP may be substantially reduced.

According to an embodiment, the sensor part TSP may be disposed on the light-emitting-element layer EML (or, for example, the encapsulation layer TFE). According to an embodiment, the sensor part TSP may be directly disposed on the encapsulation layer TFE. The sensor part TSP may comprise an insulating layer INS, a first conductive pattern layer CP1, the functional insulating layer 2000, a second conductive pattern layer CP2, and a protective layer PVX.

According to an embodiment, the first conductive pattern layer CP1 and the second conductive pattern layer CP2 may be patterned at one position to form the sensing electrodes SP. For example, a portion of each of the first conductive pattern layer CP1 and the second conductive pattern layer CP2 may configure the first sensing electrode SP1, and a portion of the second conductive pattern layer CP2 may configure the second sensing electrode SP2. However, the disclosure is not limited thereto.

The insulating layer INS may be disposed on the encapsulation layer TFE. The insulating layer INS may form the sensor base layer SBSL, and may provide an area where the first conductive pattern layer CP1, the functional insulating layer 2000, the second conductive pattern layer CP2, and the protective layer PVX are disposed. The insulating layer INS may comprise, for example, an inorganic material. The inorganic material may comprise one or more of a group of silicon nitride ($SiN_x$), silicon oxide ($SiO_x$), silicon oxynitride ($SiO_xN_y$), and aluminum oxide ($AlO_x$). However, the disclosure is not limited thereto.

The first conductive pattern layer CP1 may be disposed on the insulating layer INS. The second conductive pattern layer CP2 may be disposed on the functional insulating layer 2000. The first conductive pattern layer CP1 and the second conductive pattern layer CP2 may be spaced apart from each other, with the functional insulating layer 2000 interposed therebetween.

The first conductive pattern layer CP1 and the second conductive pattern layer CP2 may comprise a metal layer of a single layer or multiple layers. The first conductive pattern layer CP1 and the second conductive pattern layer CP2 may comprise at least one of various metal materials comprising, but not limited to, gold (Au), silver (Ag), aluminum (Al), molybdenum (Mo), chromium (Cr), titanium (Ti), nickel (Ni), neodymium (Nd), copper (Cu), and platinum (Pt), or an alloy thereof.

According to an embodiment, the first conductive pattern layer CP1 and the second conductive pattern layer CP2 may comprise at least one of various transparent conductive materials comprising one of a silver nanowire (AgNW), indium tin oxide (ITO), indium zinc oxide (IZO), indium gallium zinc oxide (IGZO), antimony zinc oxide (AZO), indium tin zinc oxide (ITZO), zinc oxide (ZnO), tin oxide ($SnO_2$), carbon nano tube, or graphene.

The functional insulating layer 2000 may be disposed on the first conductive pattern layer CP1. The functional insulating layer 2000 may be interposed between the first conductive pattern layer CP1 and the second conductive pattern layer CP2. According to an embodiment, one surface of the functional insulating layer 2000 may contact the first conductive pattern layer CP1. Another surface of the functional insulating layer 2000 may contact the second conductive pattern layer CP2.

In an embodiment (e.g., see FIG. 5), the functional insulating layer 2000 may be comprised in the sensor part TSP to improve display quality of the display device DD. For example, the functional insulating layer 2000 may be the reflection control layer RCL. The reflection control layer RCL may extend continuously over a plurality of pixels, or sub-pixels comprising one subpixel. In other embodiments, the reflection control layer RCL may have one or more discontinuities at a location where, for example, the first conductive pattern layer CP1 and the second conductive pattern layer CP2 are electrically connected to each other.

The reflection control layer RCL may selectively absorb light of at least one wavelength band. Accordingly, the reflection control layer RCL may control the reflectance of the display device DD, and thus may improve the display quality of the display device DD.

The reflection control layer RCL may be configured to absorb at least a portion of the light in the non-emission wavelength band for the emission layer EL. For example, the reflection control layer RCL may absorb at least a portion of each of the first light of the first non-emission wavelength band and the second light of the second non-emission wavelength band.

According to an embodiment, the reflection control layer RCL may absorb at least a portion of light having a wavelength of about 460 nm to about 520 nm, and may absorb at least a portion of light having a wavelength of about 560 nm to about 620 nm. According to an embodiment, the reflection control layer RCL may absorb at least a portion of light having a wavelength of about 490 nm to about 505 nm, and may absorb at least a portion of light having a wavelength of about 585 nm to about 600 nm. Accordingly, the reflection control layer RCL may function both as an insulating structure for forming the sensor part TSP, and a layer to absorb at least a portion of the light of the non-emission wavelength band for the emission layer EL.

Structurally, the reflection control layer RCL may comprise various materials. According to an embodiment, the reflection control layer RCL may comprise a dye, a pigment, or a combination thereof. For example, the reflection control layer RCL may comprise various organic materials, and the reflection control layer RCL may comprise one or more of a group of an oxazine-based compound, a cyanine-based compound, a tetraazoporfin-based compound, and a squarylium-based compound. However, the disclosure is not limited thereto.

In one embodiment (e.g., see FIG. 6), the functional insulating layer 2000 may be comprised in the sensor part TSP to implement a full-color pixel structure of the display device DD. For example, the functional insulating layer 2000 may be the color filter layer CF.

The color filter layer CF may selectively transmit light of one color. The color filter layer CF may comprise one or more color filters CF1, CF2, and CF3 disposed in a same layer, and the one or more color filters CF1, CF2, and CF3 may be disposed in a sub-pixel SPX of a pixel corresponding to the transmitted color light (e.g., refer to FIG. 6). As shown in FIG. 6, in a multi-filter embodiment, an interface between adjacent ones of the color filters CF1, CF2, and CF3 may be at locations where the first conductive pattern layer CP1 and the second conductive pattern layer CP2 are connected to one another or overlap one another.

A first color filter CF1 may overlap the first sub-pixel area SPXA1 (in a plan view) as a color filter for forming a first sub-pixel SPX1. The first color filter CF1 may selectively transmit the light of the first color. The first color filter CF1 may comprise, for example, a red color filter material as a red color filter.

A second color filter CF2 may overlap a second sub-pixel area SPXA2 (in a plan view) as a color filter for forming a second sub-pixel SPX2. The second color filter CF2 may selectively transmit the light of the second color. The second color filter CF2 may comprise, for example, a green color filter material as a green color filter.

A third color filter CF3 may overlap a third sub-pixel area SPXA3 in a plan view as a color filter for forming a third sub-pixel SPX3. The third color filter CF3 may selectively transmit the light of the third color. The third color filter CF3 may comprise, for example, a blue color filter material as a blue color filter.

In the display device DD according to an embodiment, the functional insulating layer 2000 comprised in the sensor part TSP may insulate at least a portion of the first conductive pattern layer CP1 and the second conductive pattern layer CP2 and may also function as a functional layer (absorbing light in a non-emission band) for improving the quality of the display device DD.

In this case, since one or more layers (which in other proposed display devices exist as separate layers) may be manufactured within a single process according to one or more embodiments, the manufacturing process may be simplified. For example, the number of masks used to manufacture the display device DD according to an embodiment may be reduced, and thus process costs may be reduced.

In one embodiment, the display device DD may be manufactured to be a flexible device. According to an embodiment, the functional insulating layer 2000 may comprise an organic material, thereby improving physical characteristics that exist during an operation such as bending, rolling, or folding of the display device DD.

The protective layer PVX may be disposed on the second conductive pattern layer CP2. The protective layer PVX may comprise an organic material. The organic material may comprise, for example, at least one of acrylic resin, methacrylic resin, polyisoprene, vinyl resin, epoxy resin, urethane resin, cellulose resin, siloxane resin, polyimide resin, polyamide resin, or perylene resin. However, the disclosure is not limited thereto. According to an embodiment, the protective layer PVX may comprise an inorganic material.

As described above, the display device DD according to an embodiment may comprise first to third emission layers EL1, EL2, and EL3 emitting light of different colors. For example, the display device DD may comprise sub-pixels SPX1, SPX2, and SPX3 each forming a sub-pixel area SPXA. The sub-pixel areas SPXA may comprise the first sub-pixel area SPXA1 where the light of the first color is emitted as an area formed by the first sub-pixel SPX1, the second sub-pixel area SPXA2 where the light of the second color is emitted as an area formed by the second sub-pixel SPX2, and the third sub-pixel area SPXA3 where the light of the third color is emitted as an area formed by the third sub-pixel SPX3.

According to an embodiment, the light of the first color of the first wavelength band may be emitted from the first sub-pixel area SPXA1. The light of the second color of the second wavelength band may be emitted from the second sub-pixel area SPXA2. The light of the third color of the third wavelength band may be emitted from the third sub-pixel area SPXA3.

In an embodiment, light emitted from the first emission layer EL1 may pass through the reflection control layer RCL and may be emitted outside of the display device DD as part of a displayed image. Accordingly, the first sub-pixel area SPXA1 may be formed. Light emitted from the second emission layer EL2 may pass through the reflection control layer RCL and may be emitted outside of the display device DD. Accordingly, the second sub-pixel area SPXA2 may be formed. Light emitted from the third emission layer EL3 may pass through the reflection control layer RCL and may be emitted outside of the display device DD. Accordingly, the third sub-pixel area SPXA3 may be formed.

According to an embodiment, the reflection control layer RCL may contact the protective layer PVX. According to an embodiment, the light emitted from the emission layer EL may pass through an area that is in contact with the reflection control layer RCL and the protective layer PVX. According to an embodiment, the light emitted from the emission layer EL may sequentially pass through the reflection control layer RCL and the protective layer PVX and may be emitted outside of the display device DD.

In one embodiment, the light emitted from the first emission layer EL1 may pass through the first color filter CF1 and may be emitted outside of the display device DD. Accordingly, the first sub-pixel area SPXA1 may be formed. The light emitted from the second emission layer EL2 may pass through the second color filter CF2 and may be emitted outside of the display device DD. Accordingly, the second sub-pixel area SPXA2 may be formed. The light emitted from the third emission layer EL3 may pass through the third color filter CF3 and may be emitted outside of the display device DD. Accordingly, the third sub-pixel area SPXA3 may be formed.

According to an embodiment, the color filter layer CF may contact the protective layer PVX. According to an embodiment, the light emitted from the emission layer EL may pass through an area that is in contact with the color filter layer CF and the protective layer PVX.

According to an embodiment, a contact portion CNT may be formed in the functional insulating layer 2000 comprised in the sensor part TSP. The contact portion CNT may pass through the functional insulating layer 2000. According to an embodiment, at least a portion of the second conductive pattern layer CP2 may be electrically connected to the first conductive pattern layer CP1 through the contact portion CNT. In this case, the contact portion CNT may extend between adjacent color filters in a cross-sectional view, such as shown, for example, in FIG. 6.

The outer part OUP may be disposed on the sensor part TSP and may comprise the light blocking layer BM. The light blocking layer BM may be physically separated from the functional insulating layer 2000 disposed in the sensor part TSP.

The light blocking layer BM may comprise a light absorbing material. The light absorbing material may comprise a colorant comprising at least one of carbon black or lactam black. However, the disclosure is not necessarily limited thereto, and the light absorbing material may be implemented with one or more other materials.

According to an embodiment, the light blocking layer BM may overlap the first conductive pattern layer CP1 and the second conductive pattern layer CP2 in a plan view. Accordingly, the light blocking layer BM may reduce risk of damage or impairment to visibility by the first conductive pattern layer CP1 and the second conductive pattern layer CP2.

Figure 7:
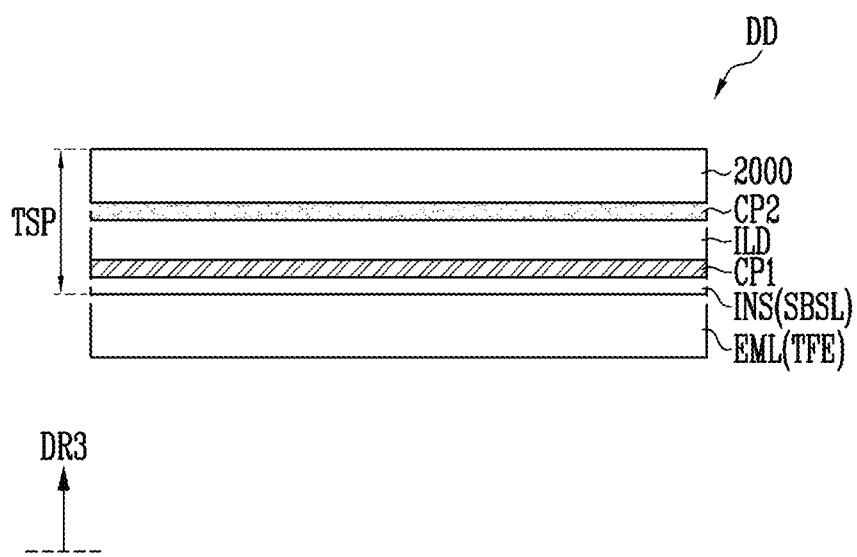
FIG. 7 is a schematic cross-sectional view illustrating a sensor part according to an embodiment.
Figure 8:
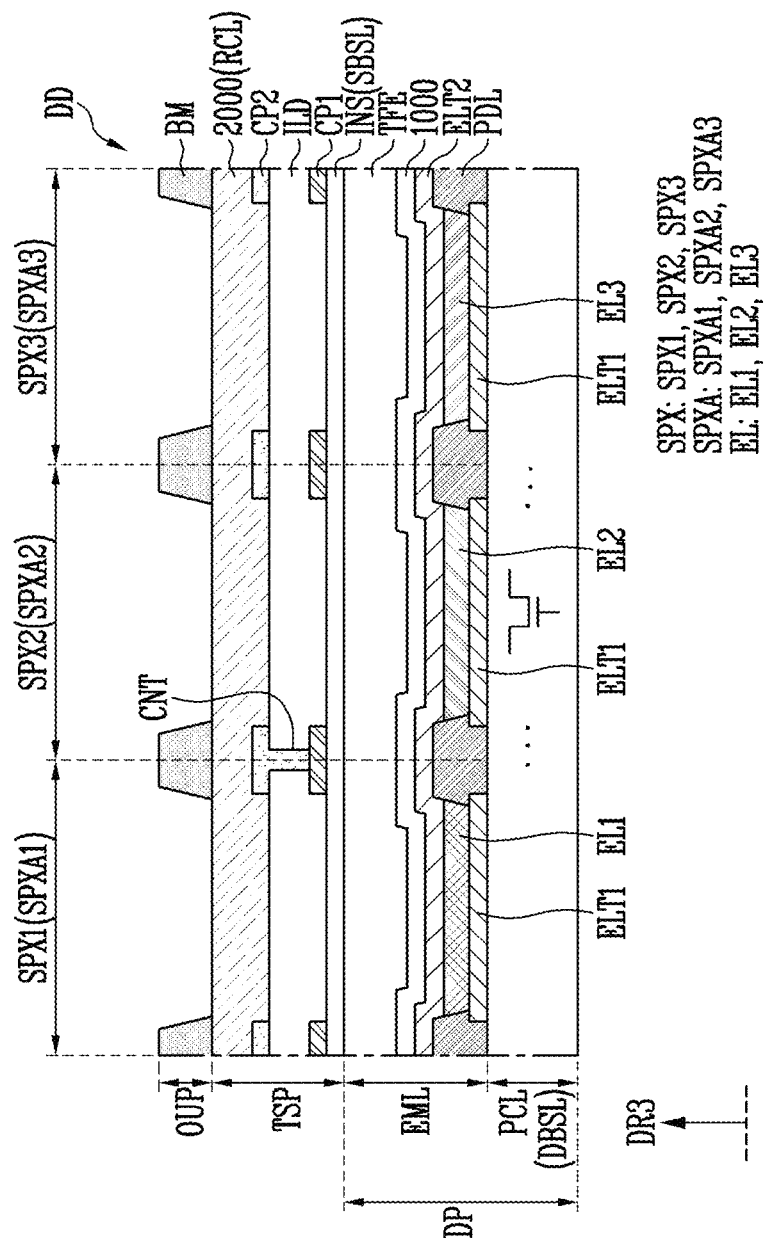
FIG. 8 is a schematic cross-sectional view illustrating a display device according to an embodiment.

FIGS. 7 and 8 illustrate an embodiment of the display device DD which comprises a functional insulating layer 2000. Content that overlaps the above-described content is briefly described or is not repeated.

FIG. 7 is a schematic cross-sectional view illustrating a sensor part according to an embodiment, and FIG. 8 is a schematic cross-sectional view illustrating a display device according to an embodiment.

The display device DD according to this embodiment is different from the display device DD according to the previous embodiment in that the functional insulating layer 2000 is disposed on the second conductive pattern layer CP2.

According to an embodiment, the sensor part TSP may comprise an interlayer insulating layer ILD. The interlayer insulating layer ILD may be disposed between the first conductive pattern layer CP1 and the second conductive pattern layer CP2. The interlayer insulating layer ILD may electrically separate at least a portion of the first conductive pattern layer CP1 from the second conductive pattern layer CP2.

The interlayer insulating layer ILD may comprise an organic material. For example, the interlayer insulating layer ILD may comprise one or more of a group of acrylic resin, epoxy resin, phenol resin, polyamide resin, and polyimide resin. However, the disclosure is not limited thereto, e.g., the interlayer insulting layer ILD may be formed of different materials in other embodiments.

The functional insulating layer 2000 may cover the second conductive pattern layer CP2. The functional insulating layer 2000 may contact an upper surface of the second conductive pattern layer CP2. The functional insulating layer 2000 may not contact the first conductive pattern layer CP1. The functional insulating layer 2000 may be disposed between the interlayer insulating layer ILD and the outer part OUP. According to an embodiment, the functional insulating layer 2000 may be disposed between the second conductive pattern layer CP2 and the light blocking layer BM.

The functional insulating layer 2000 may be the reflection control layer RCL. For example, the functional insulating layer 2000 may be provided as the reflection control layer RCL and absorb at least a portion of the light of the non-emission wavelength band for the emission layer EL.

In the present embodiment, the functional insulating layer 2000 may be a protective layer covering the second conductive pattern layer CP2. The functional insulating layer 2000 may improve display quality by controlling the reflectance of the display device DD while protecting the second conductive pattern layer CP2 from an external influence or impact. As a result, similarly to that described above, a technical effect may be provided in the form of simplifying the process operations for manufacturing the display device DD.

As described above, although the disclosure has been described with reference to the preferred embodiment above, those skilled in the art or those having a common knowledge in the art will understand that the disclosure may be variously modified and changed without departing from the spirit and technical area of the disclosure described in the claims which will be described later.

Therefore, the technical scope of the disclosure should not be limited to the contents described in the detailed description of the specification, but should be defined by the claims. The embodiments may be combined to form additional embodiments.

What is claimed is:

1. A display device comprising:
  a first sub-pixel area where a light of a first color is emitted;
  a second sub-pixel area where a light of a second color is emitted;
  a display part comprising an encapsulation layer and an emission layer configured to emit light, the emission layer comprising a first emission layer in the first sub-pixel area and a second emission layer in the second sub-pixel area; and
  a sensor part disposed on the display part and comprising:
  an insulating base layer disposed on the encapsulation layer and contacting an upper surface of the encapsulation layer,
  a first conductive pattern layer including a first sensing electrode, the first conductive pattern layer disposed on the insulating base layer and contacting an upper surface of the insulating base layer,
  a second conductive pattern layer including a second sensing electrode,
  a protective layer disposed on the second conductive pattern layer and contacting an upper surface of the second conductive pattern layer,
  and a functional insulating layer disposed between the first conductive pattern layer and the second conductive pattern layer,
  wherein:
  a single layer of the functional insulating layer is configured to absorb light in a first non-emission wavelength band and a second non-emission wavelength band different from a wavelength band of the light to be emitted from the emission layer,
  the single layer of the functional insulating layer configured to absorb light in the first non-emission wavelength band and the second non-emission wavelength band contacts an upper surface of the first conductive pattern layer and a lower surface of the second conductive pattern layer, and
  the functional insulating layer is disposed across the first sub-pixel area and the second sub-pixel area, and a first portion of the functional insulating layer in the first sub-pixel area and a second portion of the functional insulating layer in the second sub-pixel area include a same material.

2. The display device according to claim 1, wherein:
  the wavelength band of the light emitted from the emission layer comprises a first wavelength band, a second wavelength band, and a third wavelength band,
  the first non-emission wavelength band comprises a wavelength band between the third wavelength band and the second wavelength band, and
  the second non-emission wavelength band comprises a wavelength band between the second wavelength band and the first wavelength band.

3. The display device according to claim 2, wherein:
  the first non-emission wavelength band comprises at least partial band of 460 nm to 520 nm, and
  the second non-emission wavelength band comprises at least partial band of 560 nm to 620 nm.

4. The display device according to claim 3, wherein:
  the first wavelength band is a red wavelength band,
  the second wavelength band is a green wavelength band, and
  the third wavelength band is a blue wavelength band.

5. The display device according to claim 4, wherein:
  the first wavelength band is a wavelength band of 600 nm to 750 nm, the second wavelength band is a wavelength band of 480 nm to 560 nm, and
the third wavelength band is a wavelength band of 370 nm to 460 nm.

6. The display device according to claim 1, wherein the functional insulating layer comprises a dye, a pigment, or a combination thereof.

7. The display device according to claim 1, wherein:
the sensor part comprises the protective layer disposed on the second conductive pattern layer, and
the light emitted from the emission layer sequentially passes through the functional insulating layer and the protective layer.

8. The display device according to claim 1, further comprising:
a light blocking layer disposed on the sensor part,
wherein the light blocking layer overlaps the first conductive pattern layer and the second conductive pattern layer when viewed from plan view, and wherein the light blocking layer and the functional insulating layer are physically separated from each other.

9. The display device according to claim 1, wherein the first conductive pattern layer and the second conductive pattern layer are electrically connected to each other through a contact portion passing through the functional insulating layer.

10. The display device according to claim 1, wherein the display part comprises:
a light emitting element comprising a first electrode, a second electrode, and the emission layer electrically connected between the first electrode and the second electrode;
a low-reflection inorganic layer disposed on the light emitting element; and
the encapsulation layer disposed on the low-reflection inorganic layer.

11. The display device according to claim 10, wherein:
the second electrode is disposed on the emission layer, and
light reflected by the low-reflection inorganic layer and light reflected by the second electrode interfere destructively with each other.

12. The display device according to claim 10, wherein the sensor part is directly disposed on the encapsulation layer.

13. A display device comprising:
a display part comprising an encapsulation layer and an emission layer configured to emit light; and
a sensor part disposed on the display part and comprising:
an insulating base layer disposed on the encapsulation layer and contacting an upper surface of the encapsulation layer,
a first conductive pattern layer including a first sensing electrode, a second conductive pattern layer including a second sensing electrode, an interlayer insulating layer disposed between the first conductive pattern layer and the second conductive pattern layer, and a functional insulating layer configured to absorb light of a non-emission wavelength band different from a wavelength band of the light emitted from the emission layer, wherein:
the functional insulating layer comprises one or more of a group of an oxazine-based compound, a cyanine-based compound, a tetraazoporfin-based compound, and a squarylium-based compound,
the functional insulating layer configured to absorb light of the non-emission wavelength band contacts an upper surface of the second conductive pattern layer including the second sensing electrode, and
a light blocking layer is disposed on the sensor part, and wherein the light blocking layer overlaps the first conductive pattern layer and the second conductive pattern layer, when viewed from a plan view.

14. The display device according to claim 13, wherein:
the non-emission wavelength band comprises a first non-emission wavelength band and a second non-emission wavelength band,
the wavelength band of the light emitted from the emission layer comprises a first wavelength band, a second wavelength band, and a third wavelength band,
the first non-emission wavelength band comprises a wavelength band between the third wavelength band and the second wavelength band, and
the second non-emission wavelength band comprises a wavelength band between the second wavelength band and the first wavelength band.

15. The display device according to claim 14, wherein:
the first non-emission wavelength band comprises at least partial band of 460 nm to 520 nm,
the second non-emission wavelength band comprises at least partial band of 560 nm to 620 nm,
the first wavelength band is a red wavelength band,
the second wavelength band is a green wavelength band, and
the third wavelength band is a blue wavelength band.

16. The display device according to claim 13, wherein the display part comprises:
a light emitting element comprising a first electrode, a second electrode, and the emission layer electrically connected between the first electrode and the second electrode;
a low-reflection inorganic layer disposed on the light emitting element; and
the encapsulation layer disposed on the low-reflection inorganic layer.

17. The display device according to claim 16, wherein:
the second electrode is disposed on the emission layer, and
light reflected by the low-reflection inorganic layer and light reflected by the second electrode interfere destructively with each other.

18. The display device according to claim 13, wherein the functional insulating layer contacts the upper surface of the second conductive pattern layer and does not contact the first conductive pattern layer, and wherein the interlayer insulating layer contacts a lower surface of the second conductive pattern layer.

19. The display device according to claim 13, wherein the functional insulating layer comprises a dye, a pigment, or a combination thereof.

20. A display device comprising:
a first sub-pixel area where a light of a first color is emitted;
a second sub-pixel area where a light of a second color is emitted;
a display panel comprising an emission layer; and
a touch sensor disposed on the display panel and including a functional insulating layer, wherein:
the emission layer comprising a first emission layer in the first sub-pixel area and a second emission layer in the second sub-pixel area, the first emission layer is configured to emit light in a first wavelength band and the second emission layer is configured to emit light in a second wavelength band through the functional insulating layer of the touch sensor,
a single layer of the functional insulating layer is configured to absorb light in a non-emission wavelength band different from the first wavelength band and the second wavelength band,
the non-emission wavelength band comprises a first non-emission wavelength band and a second non-emission wavelength band, and the functional insulating layer is disposed across the first sub-pixel area and the second sub-pixel area, and a first portion of the functional insulating layer in the first sub-pixel area and a second portion of the functional insulating layer in the second sub-pixel area include a same material.

21. The display device according to claim 20, wherein:
the touch sensor includes a first conductive pattern layer and a second conductive pattern layer which overlap a pixel defining layer of the display panel, and
the functional insulating layer is between the first conductive pattern layer and the second conductive pattern layer.

22. The display device according to claim 21, wherein:
the second conductive pattern layer is disposed over the first conductive pattern layer, and
the functional insulating layer is disposed on an upper surface of the first conductive pattern layer.

23. The display device according to claim 20, wherein the non-emission wavelength band is adjacent to the first wavelength band.

24. The display device according to claim 20, wherein the functional insulating layer is a reflection control layer.

* * * * *